United States Patent
Lai et al.

(10) Patent No.: US 10,497,714 B2
(45) Date of Patent: Dec. 3, 2019

(54) THREE DIMENSIONAL MEMORY DEVICE WITH ETCH-STOP STRUCTURE

(71) Applicant: MACRONIX INTERNATIONAL CO., LTD., Hsinchu (TW)

(72) Inventors: Erh-Kun Lai, Taichung (TW); Hsiang-Lan Lung, Kaohsiung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 102 days.

(21) Appl. No.: 15/664,026

(22) Filed: Jul. 31, 2017

(65) Prior Publication Data
US 2019/0035802 A1    Jan. 31, 2019

(51) Int. Cl.
| H01L 27/11582 | (2017.01) |
| H01L 21/311 | (2006.01) |
| H01L 21/768 | (2006.01) |
| H01L 27/11565 | (2017.01) |

(52) U.S. Cl.
CPC .. H01L 27/11582 (2013.01); H01L 21/31144 (2013.01); H01L 21/76832 (2013.01); H01L 27/11565 (2013.01)

(58) Field of Classification Search
CPC ......... H01L 27/11582; H01L 27/11565; H01L 21/31144; H01L 21/76832; H01L 27/11531; H01L 27/1128; H01L 27/2481; H01L 27/2454; H01L 27/1052; H01L 27/11575
See application file for complete search history.

(56) References Cited

U.S. PATENT DOCUMENTS

| 8,482,138 B2 | 7/2013 | Hwang et al. |
| 8,829,599 B2 | 9/2014 | Ahn |
| 8,912,593 B2 | 12/2014 | Matsuda |
| 9,455,270 B1 | 9/2016 | Lai |
| 2014/0162420 A1 | 6/2014 | Oh et al. |
| 2014/0264925 A1 | 9/2014 | Chen |

FOREIGN PATENT DOCUMENTS

TW    201709412 A    3/2017

OTHER PUBLICATIONS

TIPO Office Action dated Feb. 26, 2018 in Taiwan application (No. 106127373).

(Continued)

*Primary Examiner* — Stephen W Smoot
*Assistant Examiner* — Pavel G Ivanov
(74) *Attorney, Agent, or Firm* — McClure, Qualey & Rodack, LLP

(57) ABSTRACT

A 3D memory device includes a substrate, a multi-layers stack, at least one memory structure and an etching stop structure. The substrate has a trench. The multi-layers stack includes a first extending portion forming a non-straight angle with a bottom surface of the trench and a second extending portion, wherein both of the first extending portion and the second extending portion include a plurality of conductive layers and a plurality of insulating layers alternatively stacked in the trench. The memory structure is formed in the first extending portion. The etching stop structure is at least partially disposed in the second extending portion and has a material identical to that of the memory structure.

15 Claims, 15 Drawing Sheets

(56) References Cited

OTHER PUBLICATIONS

Kim, et al.: "Novel 3-D Structure for Ultra High Density Flash Memory with VRAT (Vertical-Recess-Array-Transistor) and PIPE (Planarized Integration on the same PlanE)"; 2008 Symposium on VLSI Technology Digest of Technical Papers; pp. 122-123.

Chen, et al.: "A Highly Scalable 8-layer Vertical Gate 3D NAND with Split-page Bit Line Layout and Efficient Binary-sum MiLC (Minimal Incremental Layer Cost) Staircase Contacts"; 978-1-4673-4871-3/12/$31.00 © 2012 IEEE; pp. 2.3.1-2.3.4.

THREE DIMENSIONAL MEMORY DEVICE WITH ETCH-STOP STRUCTURE

BACKGROUND OF THE INVENTION

Field of the Invention

The invention relates in general to a memory device and the method for fabricating the same, and more particularly to a three-dimensional (3D) memory device and the method for fabricating the same.

Description of the Related Art

A 3D memory device, such as a 3D flash memory device having a single gate, a double gate or a surrounding gate, that includes a 3D memory cell array having vertical channels formed in a multi-layer stack and possesses a higher memory density and excellent electrical characteristics, e.g. reliability in data storage and high operating speed has been widespreadly adopted by portable audiovisual entertainment devices, cell phones or digital cameras etc.

Recently, the demands for a 3D memory device tends to be smaller in size and larger memory capacity. In order to provide a 3D memory device having larger memory density, the critical size of the multi-layer stack should be shrank. However, as the shrinkage of the critical size, it is harder to manufacture a 3D memory device due to rapidly increasing process complexity. In addition, the performance and reliability of the 3D memory device could be deteriorated by the program/erase interference occurring between two adjacent memory cells formed in the multi-layer stack due to the shrinkage of the critical size.

Therefore, there is a need of providing a 3D memory device and the method for fabricating the same to obviate the drawbacks encountered from the prior art.

SUMMARY OF THE INVENTION

According to one embodiment of the present disclosure, a 3D memory device is provided, wherein the 3D memory device includes a substrate, a multi-layers stack, at least one memory structure and an etching stop structure. The substrate has a trench; the multi-layers stack includes a first extending portion and a second extending portion forming a non-straight angle with a bottom surface of the trench, wherein both of the first extending portion and the second extending portion include a plurality of conductive layers and a plurality of insulating layers alternatively stacked in the trench. The memory structure is formed in the first extending portion. The etching stop structure is at least partially disposed in the second extending portion and has a material identical to that of the memory structure.

According to another embodiment of the present disclosure, a method for fabricating a 3D memory device is provided, wherein the method includes steps as follows: Firstly, a substrate having a trench is provided. A multi-layers stack having a first extending portion and a second extending portion is then formed in the trench to make the first extending portion and a bottom surface of the trench forming a non-straight angle, wherein both of the first extending portion and the second extending portion include a plurality of conductive layers and a plurality of insulating layers alternatively stacked in the trench. Next, at least one memory structure is formed in the first extending portion; and an etching stop structure having a material identical to that of the memory structure and at least partially extending into the second extending portion is formed.

In accordance with the aforementioned embodiments of the present disclosure, a 3D memory device and the method for fabricating the same are provided. A multi-layers stack having a first extending portion and a second extending portion is firstly formed in a trench of a substrate to make both of the first extending portion and the second extending portion include a plurality of conductive layers and a plurality of insulating layers alternatively stacked in the trench, and to make the second extending portion forming a non-straight angle with a bottom surface of the trench. At least one memory structure is formed in the first extending portion, and meanwhile an etching stop structure having a material identical to that of the memory structure is formed in the trench and at least partially extending into the second extending portion.

Each one of the conductive layers involved in the second extending portion can provide a landing area to allow a contact via formed thereon and electrically connected to a word line of the 3D memory device. Thus, the conventional staircase contact structure occupying a larger device surface area is no longer required; the size of the 3D memory device can thus be significantly decreased; and there are more space for forming additional memory cells. The memory structures and the etching stop structure can respectively support the first extending portion and the second extending portion, during process, to prevent the multi-layer stack from being deformed or collapsed. The process window and yields of the process for forming a 3D memory device with larger memory density can be improved. In addition, since the etching stop structure and the memory structure can be formed by the same steps, thus the manufacturing process of 3D memory device can be simplified, and the manufacturing cost can be decreased.

BRIEF DESCRIPTION OF THE DRAWINGS

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1:
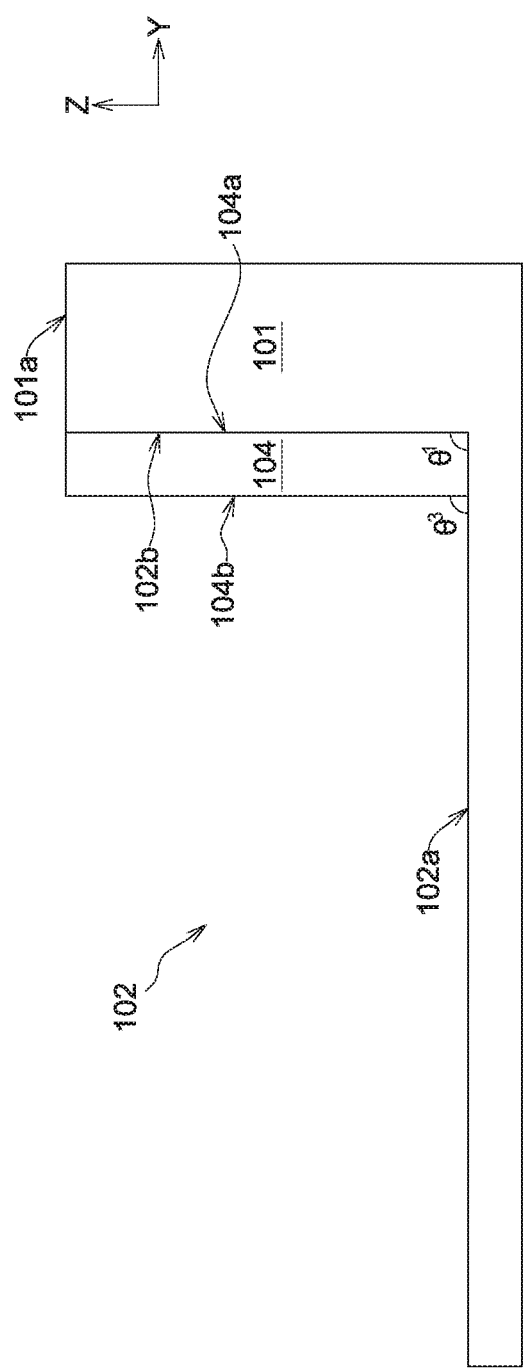
FIG. 1 is a cross-sectional view illustrating a substrate in accordance with one embodiment of the present disclosure.

A 3D memory device and the method for fabricating the same is provided to decrease the device size, simplify the manufacturing process, improve the process window and yields and increase the memory density thereof. A number of embodiments of the present disclosure are disclosed below with reference to accompanying drawings.

However, the structure and content disclosed in the embodiments are for exemplary and explanatory purposes only, and the scope of protection of the present disclosure is not limited to the embodiments. Designations common to the accompanying drawings and embodiments are used to indicate identical or similar elements. It should be noted that the present disclosure does not illustrate all possible embodiments, and anyone skilled in the technology field of the invention will be able to make suitable modifications or changes based on the specification disclosed below to meet actual needs without breaching the spirit of the invention. The present disclosure is applicable to other implementations not disclosed in the specification. In addition, the drawings are simplified such that the content of the embodiments can be clearly described, and the shapes, sizes and scales of elements are schematically shown in the drawings for explanatory and exemplary purposes only, not for limiting the scope of protection of the present disclosure.

In some embodiments of the present disclosure, the 3D memory device 100 can be a vertical channel NAND flash memory device. The method for forming the 3D memory device 100 includes steps as follows: Firstly, a substrate 101 having a trench 102 is provided (see FIG. 1).

In some embodiments of the present disclosure, the substrate 101 can be a semiconductor substrate made of semiconductor material, such as n-type poly-silicon, p-type poly-silicon, germanium or other suitable semiconductor material. The trench 102 may be a recess formed by an anisotropic etching process, such as a reactive ion etching (RIE) process. In the present embodiment, the trench 102 has a horizontal bottom surface 102a (parallel to the Y axis) and a sidewall 102b extending from the top surface 101a of the substrate 101 along the Z axis to the bottom surface 102a of the trench 102, wherein the sidewall 102b and the bottom surface 102a connected with each other and form a non-straight (non-180°) angle $\ominus 1$ substantially equal (but not limited) to 90°.

Figure 2:
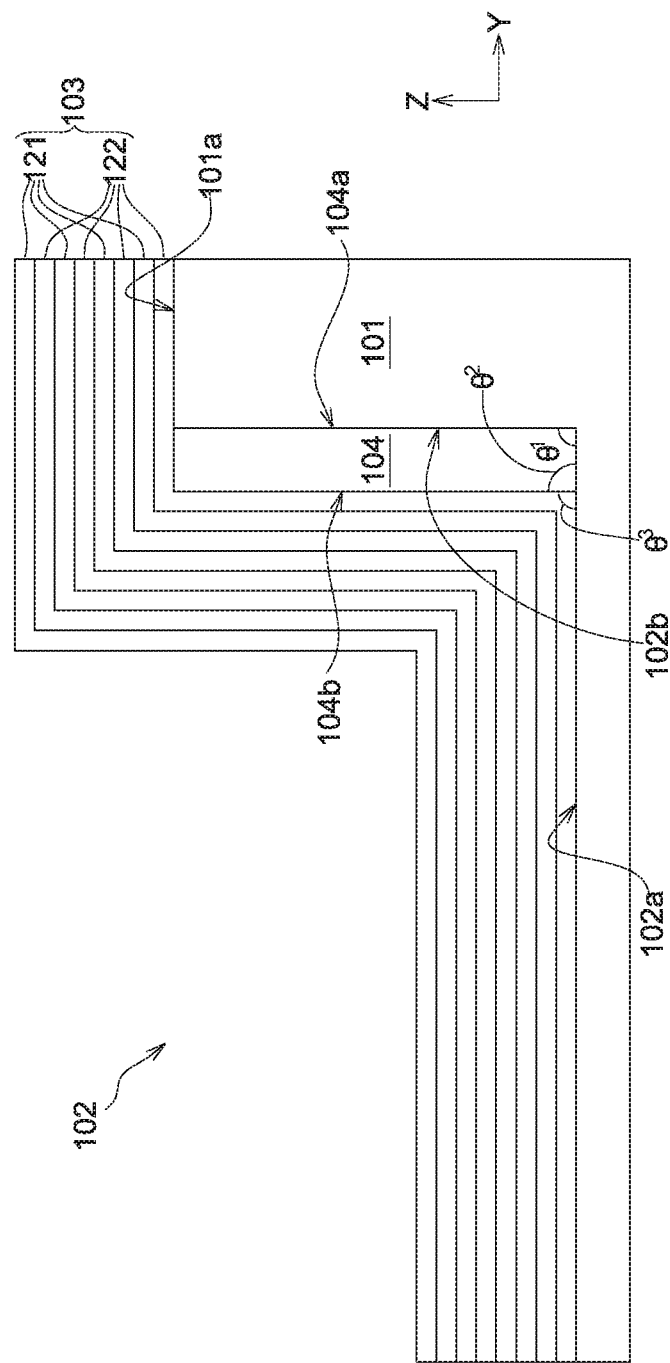
FIG. 2 is a cross-sectional view illustrating the result after a multi-layers stack is formed on the structure depicted in FIG. 1.

Next, a multi-layers stack 103 is formed in the trench 102. FIG. 2 is a cross-sectional view illustrating the result after a multi-layers stack 103 is formed on the structure depicted in FIG. 1. In some embodiments of the present disclosure, the process for forming the multi-layers stack 103 includes steps of performing a plurality of deposition processes, e.g. low pressure chemical vapor deposition (LPCVD), along the vertical (Z) direction to form a plurality of stacking layers 121 and a plurality of insulating layers 122 alternatively stacked with each other and covering on the top surface 101a of the substrate 101 as well as the bottom surface 102a and the sidewall 102b of the trench 102. In other words, two adjacent ones of the stacking layers 121 are insulated from one another by one of the insulating layers 122.

In some embodiments of the present disclosure, the insulating layers 122 may be made of dielectric material, such as silicon oxide (SiOx), silicon carbide (SiC), silicate or the arbitrary combinations thereof. The stacking layers 121 may be a plurality of conductive layers, such as doped/un-doped poly-silicon layers or metal layers. But in some other embodiments, the stacking layers 121 may be a plurality of sacrificing layers, and the material for configuring the sacrificing layers may be different from that for configuring insulating layers 122. For example, the sacrificing layers may be made of silicon-nitride compounds, such as silicon nitride (SiN), silicon oxynitride (SiON), silicon carbonitride (SiCN), or the arbitrary combinations thereof. In the present embodiment, the stacking layers 121 may be a plurality of sacrificing layers made of SiN with a thickness about 520 Å, and the insulating layers 122 are made of silicon dioxide (SiO$_2$) with a thickness about 280 Å.

Figure 3:
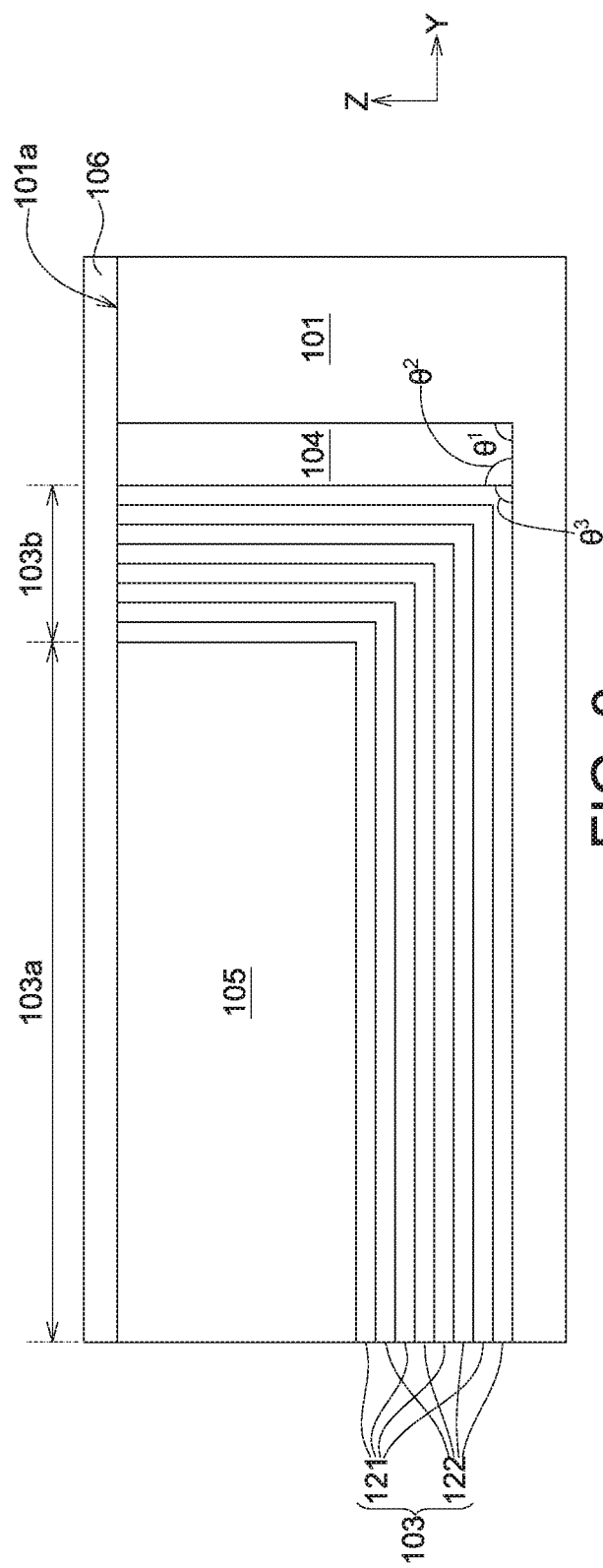
FIG. 3 is a cross-sectional view illustrating the result after a planarization process is performed on the structure depicted in FIG. 2.

Next, the multi-layers stack 103 is subjected to a planarization process. FIG. 3 is a cross-sectional view illustrating the result after a planarization process is performed on the structure depicted in FIG. 2. The process for planarizing multi-layers stack 103 includes steps as follows: A dielectric layer 105 is firstly formed on the multi-layers stack 103 to fill the trench 102. Next a polishing process, such as a chemical-mechanical polishing (CMP) process, using the top surface 101a of the substrate 101 as a stop layer is then performed to remove portions of the dielectric layer 105 and the multi-layers stack 103 disposed on the top surface 101a of the substrate 101, so as to make the remaining dielectric layer 105 and the top surface 101a of the substrate 101 coplanar. Subsequently, a capping layer 106 is formed to covering on the remaining dielectric layer 105 and the top surface 101a of the substrate 101. In some embodiments of the present disclosure, the capping layer 106 may be made of a material identical to or different from that for configuring the dielectric layer 105. In the present embodiment, the capping layer 106 may be made of SiOx.

After the planarization, the multi-layers stack 103 can be separated into a first extending portion 103a and a second extending portion 103b connected with the first extending portion 103a and forming a non-straight angle $\ominus 2$ substantially equal to the non-straight angle $\ominus 1$ with the bottom surface 102a of the trench 102. However, the non-straight angle $\ominus 2$ is not limited to this regards, in some other embodiments, the non-straight angles $\ominus 1$ and $\ominus 2$ may not be the same. In the present embodiment, the portions of the stacking layer 121 and the insulating layers parallel to the bottom surface 102a of the trench 102 is regarded to as the first extending portion 103a and the portions of the stacking layer 121 and the insulating layers vertically extending along the sidewall 102b (z axis) is regarded to as the second extending portion 103b. In other words, the portions of the stacking layer 121 and the insulating layers allocated in the first extending portion 103a are alternatively stacked along the z axis; and the portions of the stacking layer 121 and the insulating layers allocated in the second extending portion 103b are alternatively stacked along the Y axis.

In some embodiments of the present disclosure, the process for forming the 3D memory device 100 may include an optional step for forming an etching stop block 104 in the trench (see FIG. 1) prior to the forming of the multi-layers stack 103. In the present embodiment, the etching stop block 104 can be a SiOx spacer formed by a deposition process or a thermal oxidation process on the sidewall 102b of the trench 102. The etching stop block 104 has a sidewall 104a connected to the sidewall 102b of the trench 102 and an opposite sidewall 104b substantially parallel to the sidewall 102b of the trench 102; and both of the sidewalls 104a and 104b can respectively form a non-straight angle $\ominus 3$ substantially equal to the non-straight angle $\ominus 1$ with the bottom surface 102a of the trench 102. Thus after the multi-layers stack 103 is formed, the first extending portion 103a of the multi-layers stack 103 can horizontally extend on the bottom surface 102a of the trench 102; the etching stop block 104 is disposed between the sidewall 102b of the trench 102 and the second extending portion 103b of the multi-layers stack 103; and the second extending portion 103b can vertically extend along the sidewall 104b of the etching stop block 104. However, the non-straight angle $\ominus 3$ is not limited to this regards, in some other embodiments, the non-straight angles $\ominus 1$ and $\ominus 3$ may not be the same.

Figure 4A:
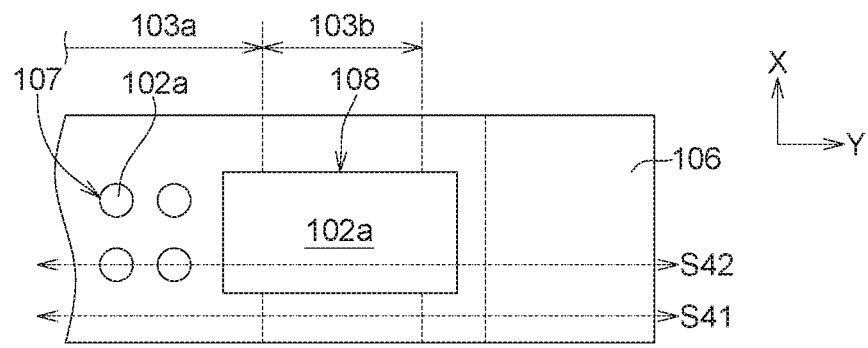
FIG. 4A is a prospective view illustrating the result after an etching process is performed on the structure depicted in FIG. 3.
Figure 4B:
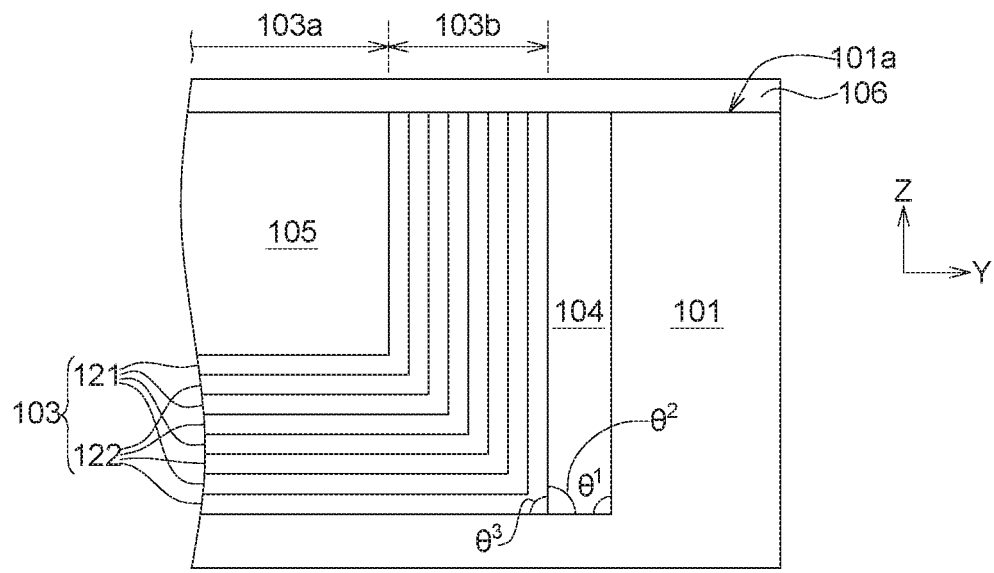
FIG. 4B is a cross-sectional view taken along the section line S41 of FIG. 4A.
Figure 4C:
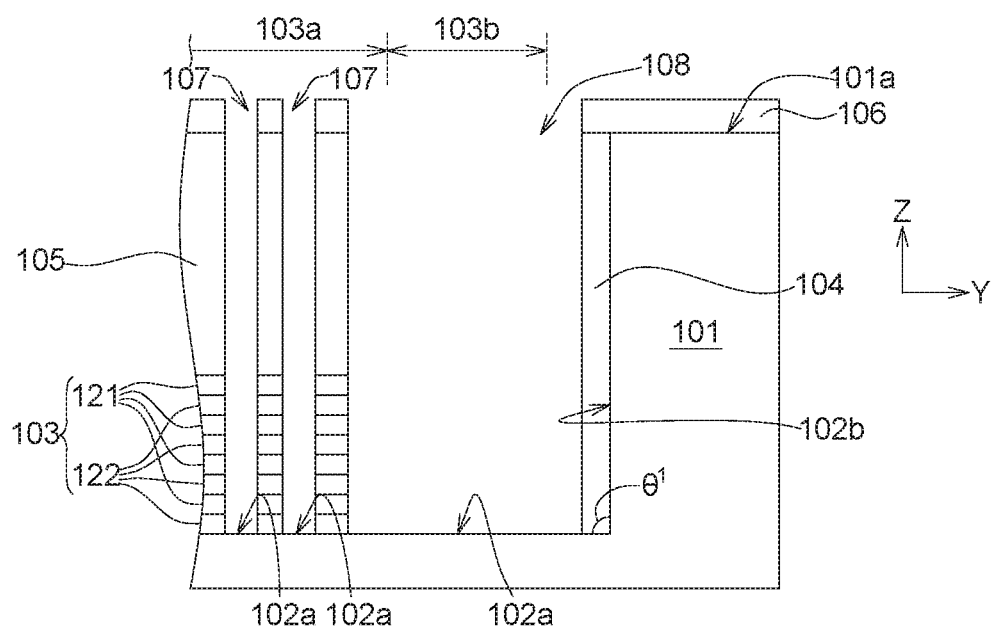
FIG. 4C is a cross-sectional view taken along the section line S42 of FIG. 4A.

Next, the multi-layers stack 103 is subjected to an etching process to form at least one first opening 107 in the first extending portion 103a and at least one second opening 108 at least partially extending into the second extending portion 103b. FIG. 4A is a prospective view illustrating the result after an etching process is performed on the structure depicted in FIG. 3; FIG. 4B is a cross-sectional view taken along the section line S41 of FIG. 4A; and FIG. 4C is a cross-sectional view taken along the section line S42 of FIG. 4A.

In some embodiments of the present disclosure, the etching process for forming of the first opening 107 and the second opening 108 includes an anisotropic etching process, such as a RIE process, performed on the multilayers stack 103, the dielectric layer 105 and the capping layer 106 using a patterned hard mask layer (not shown) as an etching mask, so as to form a plurality of the first openings 107 at least partially passing through the stacking layers 121 and the insulating layers 122 involved in the first extending portion 103a, and to form a plurality of the second opening 108 at least partially passing through the stacking layers 121 and the insulating layers 122 involved in the second extending portion 103b.

In the present embodiment, the first opening 107 may be a plurality of through holes passing through portions of the capping layer 106 and the dielectric layer 105 disposed on the first extending portion 103a as well as the stacking layers 121 and the insulating layers 122 involved in the first extending portion 103a to expose a portion of the bottom surface 102a of the trench 102. The second opening 108 may be a rectangular recess crossing over a portion of the first extending portion 103a and the whole second extending portion 103b.

In detail, a portion of the second opening 108 passing though portions of the capping layer 106 and the dielectric layer 105 disposed on the first extending portion 103a as well as the stacking layers 121 and the insulating layers 122 involved in the first extending portion 103a to expose a portion of the bottom surface 102a of the trench 102 under the first extending portion 103a; and another portion of the second opening 108 passing though the portion of the capping layer 106 disposed on the second extending portion 103b as well as the stacking layers 121 and the insulating layers 122 involved in the second extending portion 103b to expose a portion of the bottom surface 102a of the trench 102 under the second extending portion 103b.

In some other embodiments, the second opening 108 may further cross over the etching stop block 104 and pass through the etching stop block 104 and the portion of the capping layer 106 disposed on the etching stop block 104, so as to expose a portion of the bottom surface 102a of the trench 102 under the etching stop block 104 (see FIGS. 4A and 4B).

Figure 5A:
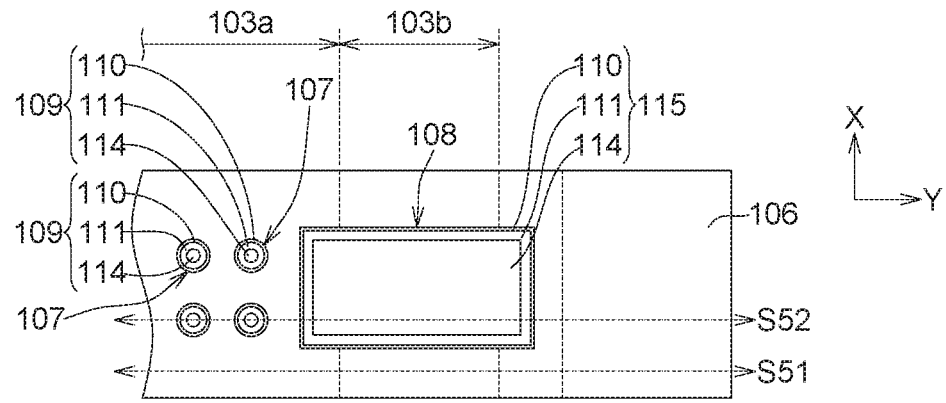
FIG. 5A is a prospective view illustrating the result after the memory structure and the etching stop structure are formed on the structure depicted in FIGS. 4A to 4C.
Figure 5B:
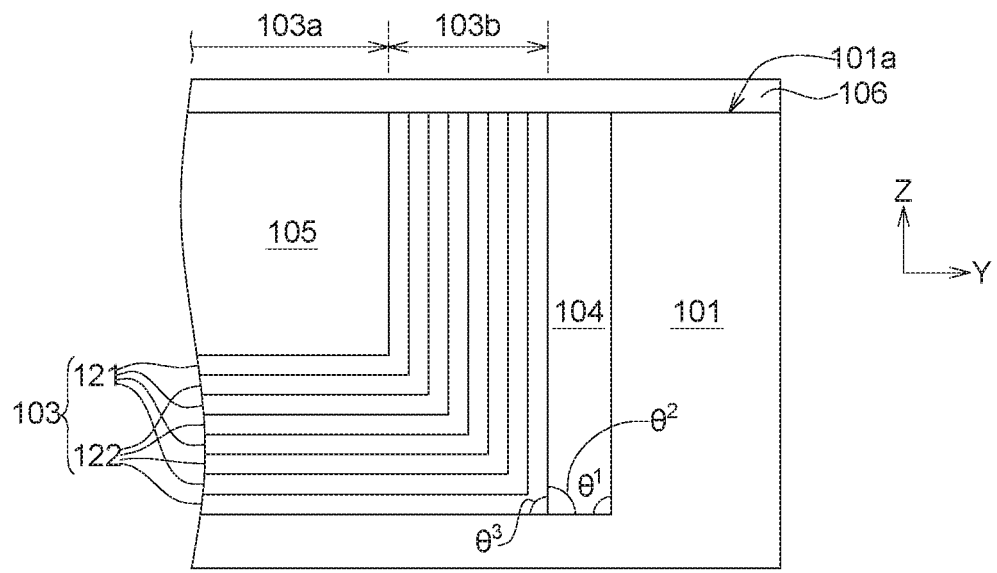
FIG. 5B is a cross-sectional view taken along the section line S51 of FIG. 5A.
Figure 5C:
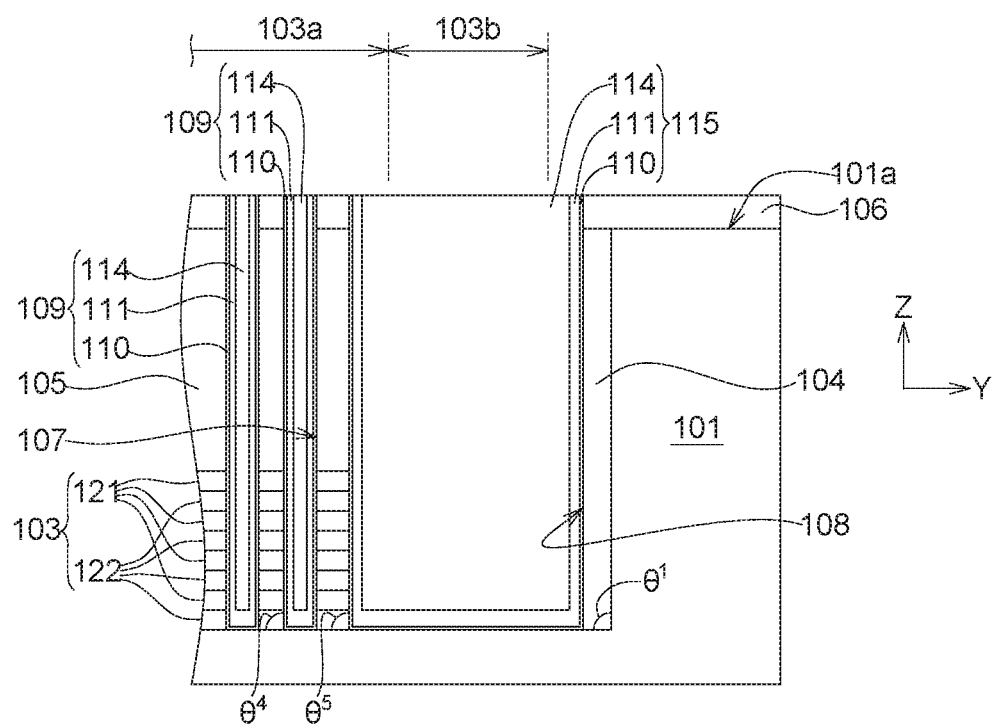
FIG. 5C is a cross-sectional view taken along the section line S52 of FIG. 5A.

Subsequently, at least one memory structure 109 is formed in the first openings 107, and an etching stop structure 115 in the second openings 108 simultaneously. FIG. 5A is a prospective view illustrating the result after the memory structure 109 and the etching stop structure 115 are formed on the structure depicted in FIGS. 4A to 4C; FIG. 5B is a cross-sectional view taken along the section line S51 of FIG. 5A; and FIG. 5C is a cross-sectional view taken along the section line S52 of FIG. 5A.

The process for forming of the memory structure 109 and the etching stop structure 115 includes steps as follows: A memory layer 110 and a channel layer 111 are formed in sequence on the top surface of the multi-layers stack 103, the sidewalls of the first openings 107 and the second opening 108 and the portion of the bottom surface 102a of the trench 102 exposed from the first openings 107 and the second opening 108, whereby a portion of the memory layer 110 can be disposed between a portion of the channel layer 111 and portions of the stacking layer 121 and the insulating layers exposed from the first openings 107 and the second opening 108.

In some embodiment of the present disclosure, the memory layer 110 may be a stack of composite layers which is selected from (but not limited to) a group consisting of oxide-nitride-oxide (ONO), oxide-nitride-oxide-nitride-oxide, (ONONO), silicon-oxide-nitride-oxide-silicon (SONOS), band gap engineered silicon-oxide-nitride-oxide-silicon (BE-SONOS), tantalum nitride, aluminum oxide, silicon nitride, silicon oxide, silicon (TANOS) and metal-high-k band gap-engineered silicon-oxide-nitride-oxide-silicon (MA BE-SONOS). The channel layer 111 can be made of n type poly-silicon or n type single crystal epitaxial silicon doped with n type dopants (e.g. phosphorus or arsenic) or can be made of p type poly-silicon or single crystal epitaxial silicon doped with p type dopants (e.g. boron).

Next, portions of the memory layer 110 and the channel layer 111 disposed on the top surface of the multi-layers stack 103 and the bottom surfaces of the first openings 107 and the second opening 108, so as to expose a portion of the bottom surface 102a of the trench 102 from the first openings 107 and the second opening 108. Subsequently, a dielectric material 114 is filled into the first openings 107 and the second opening 108 to form a plurality of memory structures 109 in the first openings 107 and an etching stop structure 115 in the second openings 108, respectively. The memory structures 109 configured by a portions of the memory layer 110, the channel layer 111 and the dielectric material 114 are shaped as a plurality of pillars; and the etching stop structure 115 also configured by a portions of the memory layer 110, the channel layer 111 and the dielectric material 114 has a block structure. In some embodiments of the present invention, the dielectric material 114 may be silicon oxide, silicon nitride, silicon oxynitride, high dielectric constant (high-k) materials or the arbitrary combinations thereof.

In some embodiments, each of the pillar memory structures 109 vertically (along the Z axis) passes through the first extending portion 103a of the multi-layers stack 103 and forms a non-straight (non-180°) angle ⊖4 with the bottom surface 102a of the trench 102. The block etching stop structure 115 vertically passes through the first extending portion 103a and the second extending portion 103b of the multi-layers stack 103 as well as the etching stop block 104, and forms a non-straight (non-180°) angle ⊖5 with the bottom surface 102a of the trench 102. The non-straight angles ⊖4 and ⊖5 can be either the same or diverse. In the present embodiment, the non-straight angles ⊖4 and ⊖5 are substantially equal to 90°.

Figure 6A:
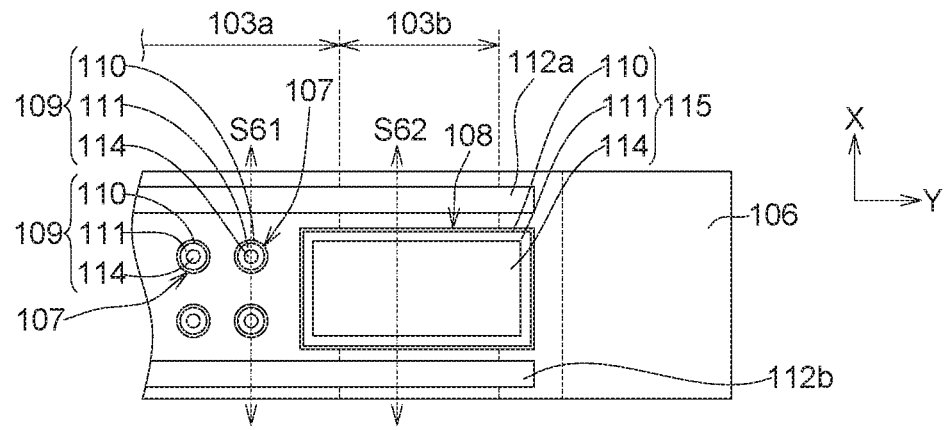
FIG. 6A is a prospective view illustrating the result after a first slit and a second slit are formed on the structure depicted in FIGS. 5A to 5C.
Figure 6B:
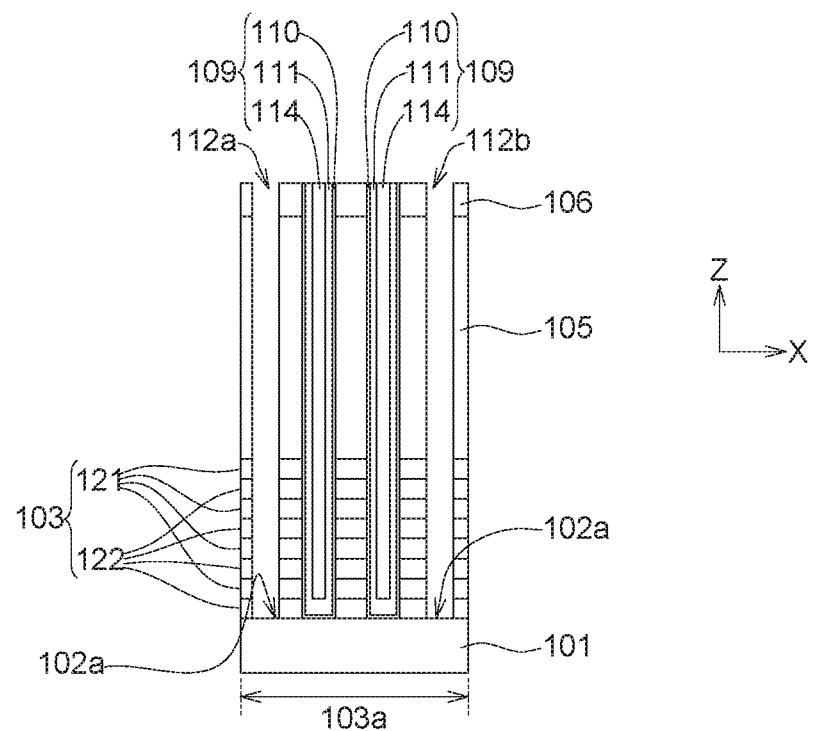
FIG. 6B is a cross-sectional view taken along the section line S61 of FIG. 6A.
Figure 6C:
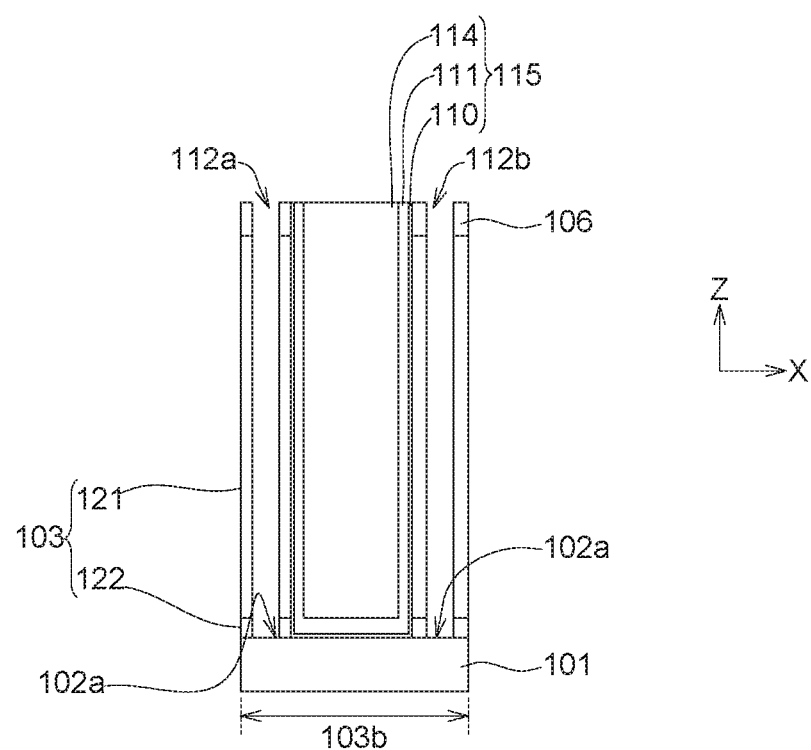
FIG. 6C is a cross-sectional view taken along the section line S62 of FIG. 6A.

Thereafter, at least one slit is formed in the multi-layers stack 103. FIG. 6A is a prospective view illustrating the result after a first slit 112a and a second slit 112b are formed on the structure depicted in FIGS. 5A to 5C; FIG. 6B is a cross-sectional view taken along the section line S61 of FIG. 6A; and FIG. 6C is a cross-sectional view taken along the section line S62 of FIG. 6A. The forming of the first slit 112a and the second slit 112b includes performing an etching process to remove portions of the capping layer 106, the dielectric layer 105, the stacking layers 121 and the insulating layers 122 to form two grooves passing through the multi-layers stack 103 along the Z axis, so as to expose a portion of the stacking layers 121 and the insulating layers 122 (see FIG. 6B), and to make the memory structure 109 and the etching stop structure 115 disposed between these two grooves (the first slit 112a and the second slit 112b).

Figure 7A:
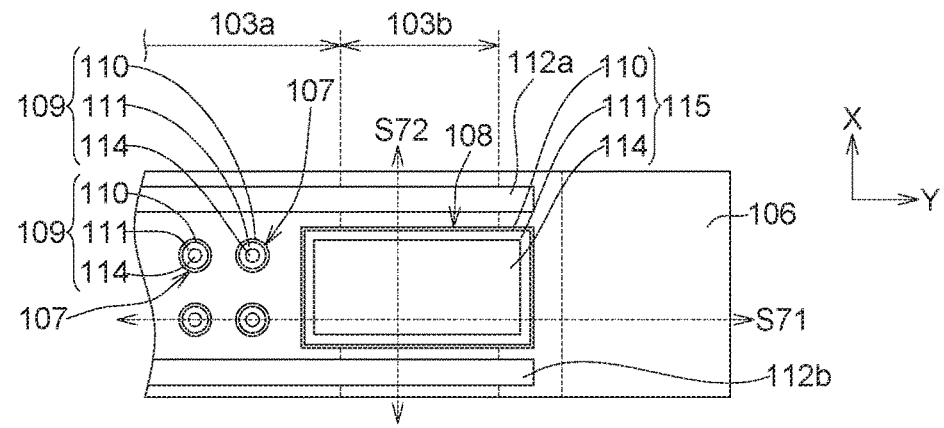
FIG. 7A is a prospective view illustrating the result after the stacking layers are removed from the structure depicted in FIGS. 6A to 6C.
Figure 7B:
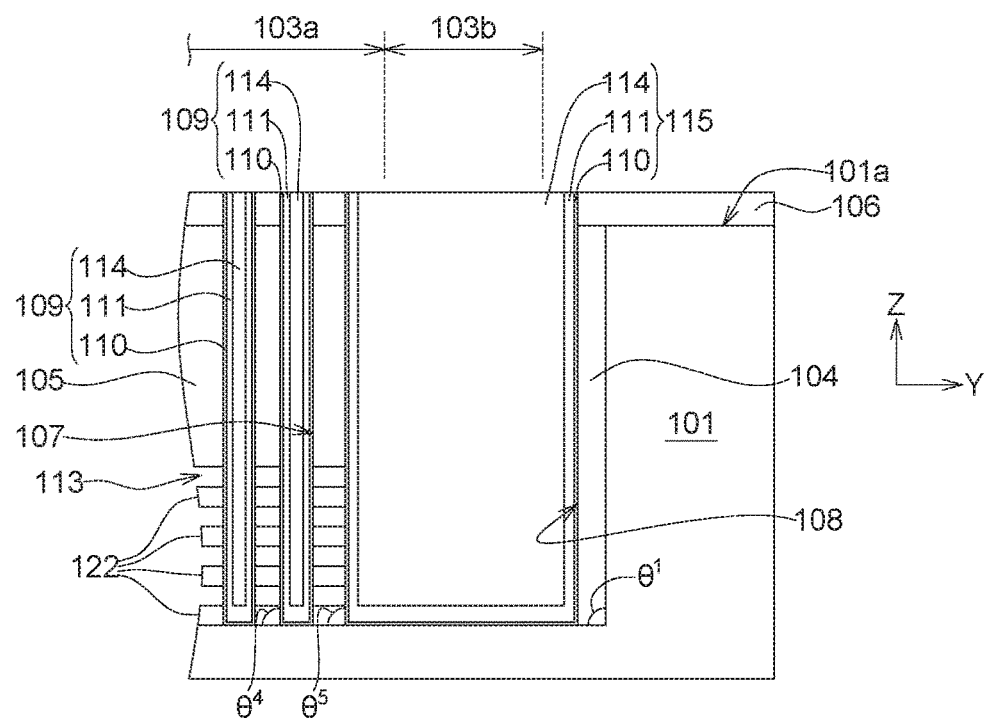
FIG. 7B is a cross-sectional view taken along the section line S71 of FIG. 7A.
Figure 7C:
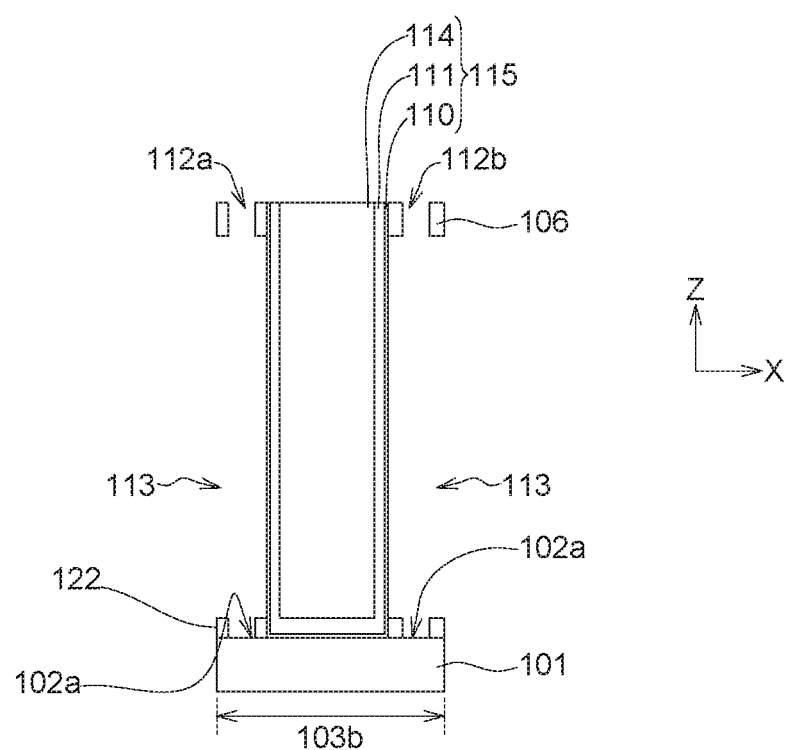
FIG. 7C is a cross-sectional view taken along the section line S72 of FIG. 7A.

The remaining stacking layers 121 serving as the sacrificing layers are then removed. FIG. 7A is a prospective view illustrating the result after the stacking layers 121 are removed from the structure depicted in FIGS. 6A to 6C; FIG. 7B is a cross-sectional view taken along the section line S71 of FIG. 7A; and FIG. 7C is a cross-sectional view taken along the section line S72 of FIG. 7A. In the present embodiment, phosphoric acid ($H_3PO_4$) solution is utilized to remove the remaining sacrificing layers (stacking layers 121) through the first slit 112a and the second slit 112b, so as to form a plurality of recesses 113 between the insulating layers 122 to expose portions of the memory layer 110.

Since, the memory structure 109 vertically passes through the first extending portion 103a, thus a vertical support can be provided to prevent the portions of the insulating layers 122 involved in the first extending portion 103a of the multi-layers stack 103 and exposed from the recesses 113 from being deformed or collapsed due to the removing of the stacking layers 121. Similarly, the etching stop structure 115 vertically passes through both the first extending portion 103a and the second extending portion 103b, as well as horizontally cross over the first extending portion 103a and the second extending portion 103b, thus it can provide both a vertical support and a horizontal support to respectively prevent the portions of the insulating layers 122 involved in the first extending portion 103a of the multi-layers stack 103 and the insulating layers 122 involved in the second extending portion 103b that are exposed from the recesses 113 from being deformed or collapsed due to the removing of the stacking layers 121. Such that the structure of the multi-layers stack 103 can be remain stable during the process.

Figure 8A:
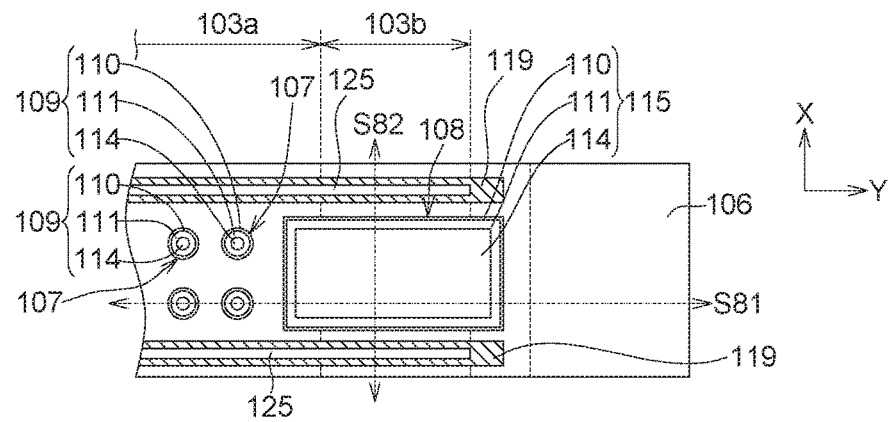
FIG. 8A is a prospective view illustrating the result after a plurality of second conductive layers are formed on the structure depicted in FIGS. 7A to 7C.
Figure 8B:
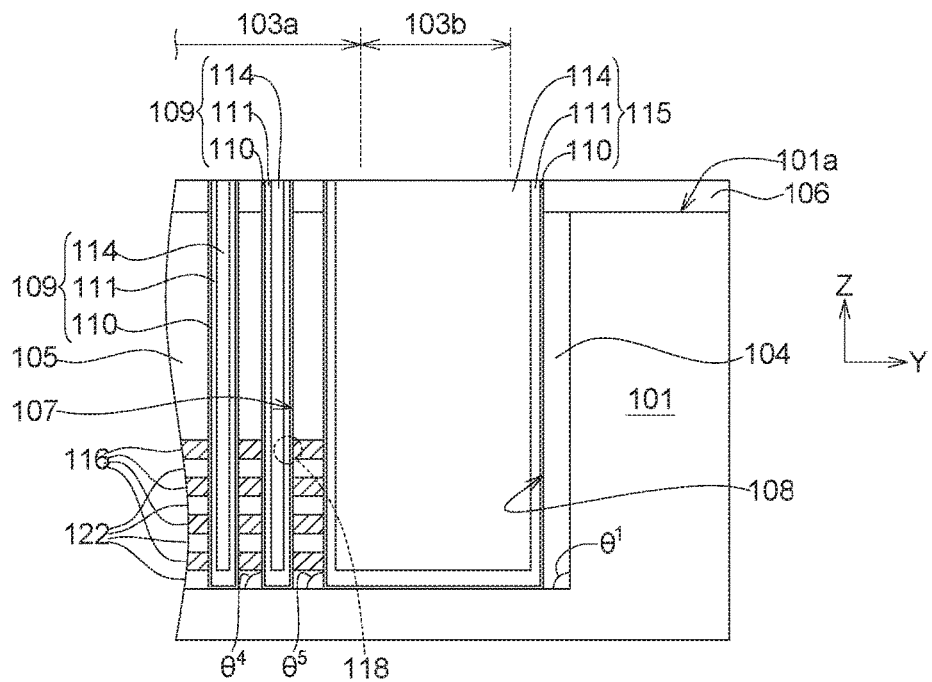
FIG. 8B is a cross-sectional view taken along the section line S81 of FIG. 8A.
Figure 8C:
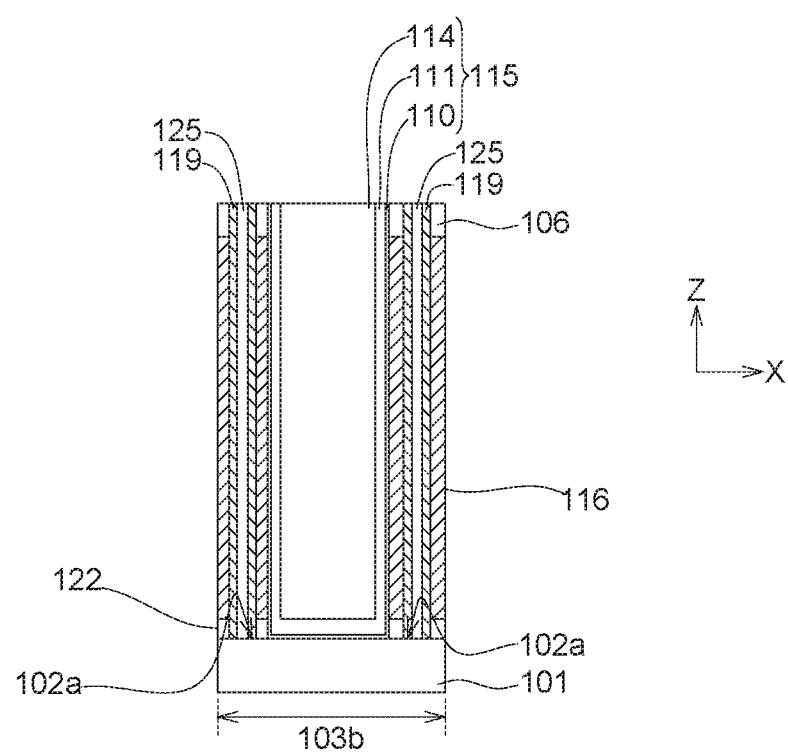
FIG. 8C is a cross-sectional view taken along the section line S82 of FIG. 8A.

Next, a plurality of conductive layers 116 are formed on the positions (the recess 113) where the remaining stacking layers 121 initially occupied. FIG. 8A is a prospective view illustrating the result after a plurality of conductive layers 116 are formed from the structure depicted in FIGS. 7A to 7C; FIG. 8B is a cross-sectional view taken along the section line S81 of FIG. 8A; and FIG. 8C is a cross-sectional view taken along the section line S82 of FIG. 8A. In some embodiments of the present disclosure, the forming of the conductive layers 116 includes depositing a conductive material, such as metal (e.g. Ti, W, Al, Cu, Au, Ag or the alloys of these metals), metal oxide (e.g. TiN) or other suitable material, by a depositing process (e.g a LPCVD process) to fill the recesses 113 defined by the insulating layers 122, so as to define a plurality of memory cells 118 on the intersection points of the memory structure 109 (the memory layer 110 and the channel layer 111) and the conductive layers 116; and the memory cells 118 can be collectively assembled to form a cell a 3D memory cell array.

After the 3D memory cell array is formed, a dielectric material is deposited to partially filling the first slit 112a and the second slit 112b, so as to form an isolating film 119 extending onto the sidewalls and the bottoms of the first slit 112a and the second slit 112b. The portions of the isolating film 119 disposed on the bottoms of the first slit 112a and the second slit 112b can be then removed by an etching process to expose a portion of the substrate 101. Next, the first slit 112a and the second slit 112b are fulfilled by a conductive material to form another conductive layer 125 in the first slit 112a and the second slit 112b, wherein the conductive layer 125 is insulated from the conductive layers 116 by the portions of the isolating film 119 extending onto the sidewalls of the first slit 112a and the second slit 112b. In the present embodiment, the conductive layer 125 may serve as the common source line of the 3D memory cell array.

Figure 9:
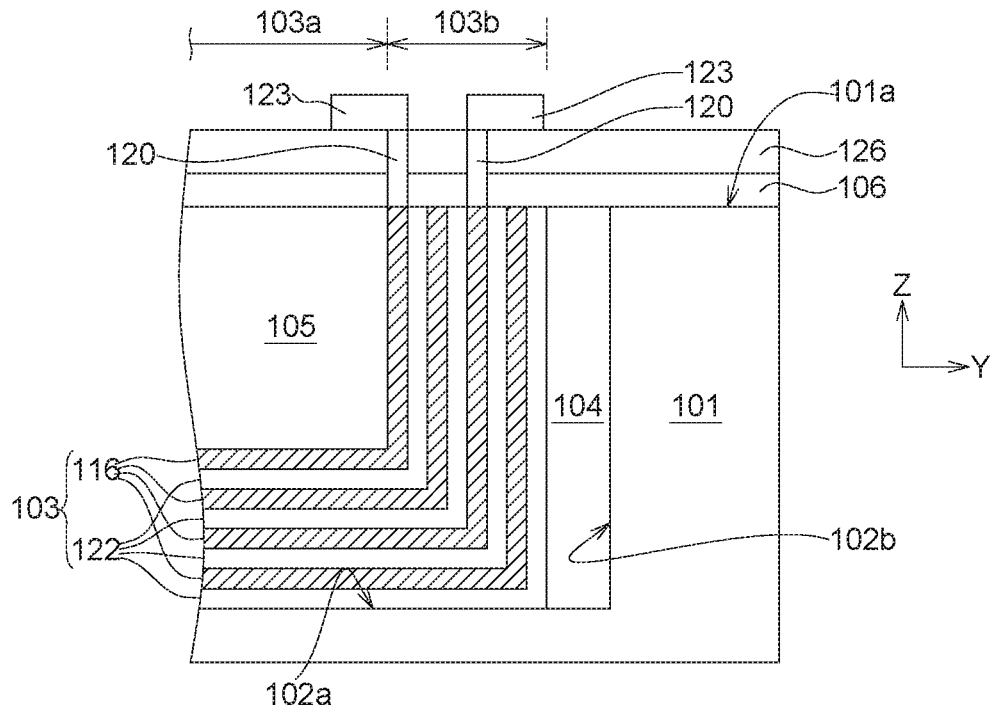
FIG. 9 is a cross-sectional view illustrating a 3D memory device in accordance with one embodiment of the present disclosure.

After a plurality of downstream processes are carried out, an inter-layer dielectric (ILD) 126 is then formed on the capping layer 106; and a plurality of interconnection vias 120 are formed in the ILD 126, wherein each of the interconnection vias 120 electrically contacts to one of the conductive layers 116 involved in the second extending portion 103b of the multi-layers stack 103; and each conductive layers 116 can be electrically connected to a word line 123 through the corresponding interconnection via 120. Meanwhile, the 3D memory device 100 as shown in FIG. 9 can be accomplished. In detail, each of the conductive layers 116 involved in the second extending portion 103b of the multi-layers stack 103 can provide a landing area for forming one of the interconnection vias 120 by which the conductive layers 116 can electrically connected to its corresponding word line 123. Such that the conventional staircase contact structure that occupies larger device surface area is no longer required, and there is more space for forming additional memory cells, thus the memory density of the 3D memory device 100 can be increased.

Figure 10:
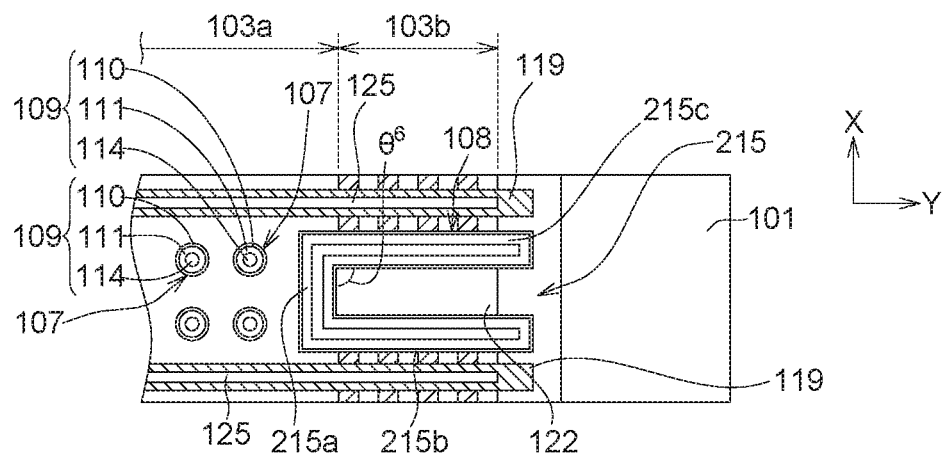
FIG. 10 is a cross-sectional view illustrating a portion of a 3D memory device parallel to the X-Y plane in accordance with another embodiment of the present disclosure.

Of note that, the structure and arrangements of the etching stop structure 115 may not be limited to this regards. FIG. 10 is a cross-sectional view illustrating a portion of a 3D memory device 200 parallel to the X-Y plane in accordance with another embodiment of the present disclosure. In the present embodiment, the etching stop structure 215 of the 3D memory device 200 includes a first finger part 215a extending along the X axis parallel to the bottom surface 102a of the trench 102, a second finger part 215b extending along the Y axis parallel to the bottom surface 102a of the trench 102 and a third finger part 215c extending along the Y axis, wherein the second finger part 215b and the third finger part 215c are parallel to each other and respectively form a non-straight (non-180°) angle ⊖6 with first finger part 215a. The first finger part 215a is disposed between the second extending portion 103b of the multi-layers stack 103 and the memory structures 109 and extends into the first extending portion 103a; the second finger part 215b and the third finger part 215c both cross over the first extending portion 103a and the second extending portion 103b of the multi-layers stack 103; and the second finger part 215b and the third finger part 215c are connected with the first finger part 215a to form a U shaped block. In other words, the etching stop structure 215 has a U shaped cross-sectional profile take from the cross-sectional plane parallel to the X-Y plane.

Figure 11:
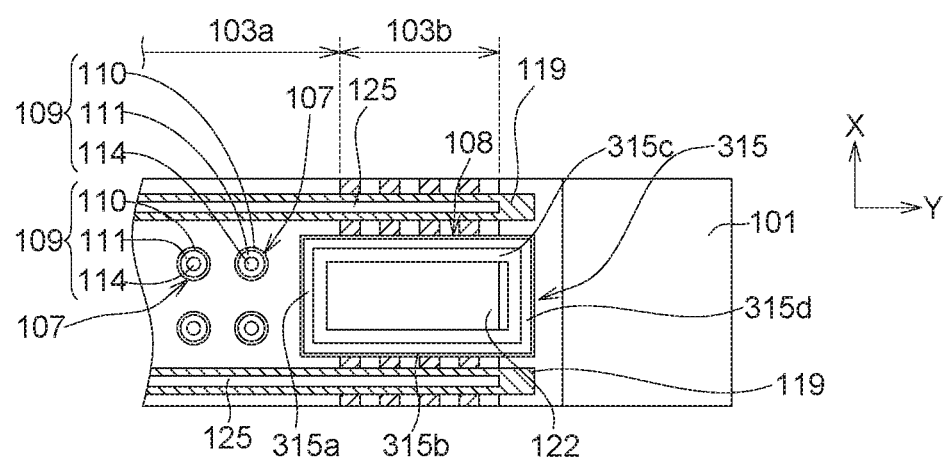
FIG. 11 is a cross-sectional view illustrating a portion of a 3D memory device parallel to the X-Y plane in accordance with yet another embodiment of the present disclosure.

FIG. 11 is a cross-sectional view illustrating a portion of a 3D memory device 300 parallel to the X-Y plane in accordance with yet another embodiment of the present disclosure. The structure of the etching stop structure 315 as depicted in FIG. 11 is similar to that of the etching stop structure 215 as depicted in FIG. 10 except that the etching stop structure 315 further includes a forth finger part 315d parallel to the first finger part 315a and connected to the second finger part 315b and the third finger part 315c. Such that, the etching stop structure 315 may have a rectangular ring profile take from the cross-sectional plane parallel to the X-Y plane.

However, the profile of the etching stop structure taken from the cross-sectional plane parallel to the X-Y plane may not be limited to this regards. In some other embodiments, the profile of the etching stop structure may be linear, corrugated, wavy, circular, polygonal, curved or the arbitrary combination thereof. Since the other elements common to that of the memory device 100 has be disclosed in the processes as depicted in FIGS. 1 to 9, thus the common processes for forming the common elements will not be redundantly described.

In accordance with the aforementioned embodiments of the present disclosure, a 3D memory device and the method for fabricating the same are provided. A multi-layers stack having a first extending portion and a second extending portion is firstly formed in a trench of a substrate to make both of the first extending portion and the second extending portion include a plurality of conductive layers and a plurality of insulating layers alternatively stacked in the trench, and to make the second extending portion form a non-straight angle with a bottom surface of the trench. At least one memory structure is then formed in the first extending portion, and meanwhile an etching stop structure having a material identical to that of the memory structure is formed in the trench and at least partially extending into the second extending portion.

Each one of the conductive layers involved in the second extending portion can provide a landing area to allow a contact via formed thereon and electrically connected to a word line of the 3D memory device. Thus, the conventional staircase contact structure occupying a larger device surface area is no longer required; the size of the 3D memory device can thus be significantly decreased; and there is more space for forming additional memory cells. The memory structures and the etching stop structure can respectively support the first extending portion and the second extending portion, during process, to prevent the multi-layer stack from being deformed or collapsed. The process window and yields of the process for forming a 3D memory device with larger memory density can be improved. In addition, since the etching stop structure and the memory structure can be formed by the same steps, thus the manufacturing process of 3D memory device can be simplified, and the manufacturing cost can be decreased.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A three dimensional (3D) memory device comprising:
    substrate, having a trench;
    a multi-layers stack comprising a first extending portion and a second extending portion forming a first non-straight angle with a bottom surface of the trench, wherein both of the first extending portion and the second extending portion include a plurality of conductive layers and a plurality of insulating layers alternatively stacked in the trench;
    at least one memory structure formed in the first extending portion; and
    an etching stop structure at least partially disposed in the second extending portion and has a set of materials identical to another set of materials in the memory structure.

2. The 3D memory device according to claim 1, wherein the first extending portion horizontally extends on the bottom surface; the second extending portion extends along a sidewall of the trench; and the sidewall and the bottom surface form an angle substantially equal to the first non-straight angle.

3. The 3D memory device according to claim 2, further comprising an etching stop block formed in the trench, wherein the etching stop block is disposed between the sidewall and the second extending portion.

4. The 3D memory device according to claim 3, wherein the etching stop structure at least partially extends into the etching stop block.

5. The 3D memory device according to claim 1, wherein the etching stop structure at least partially extends into the first extending portion.

6. The 3D memory device according to claim 1, wherein the etching stop structure comprises:
    a first finger part extending along a first direction parallel to the bottom surface; and
    a second finger part extending along a second direction parallel to the bottom surface, wherein the first direction and the second direction form a second non-straight angle.

7. The 3D memory device according to claim 6, wherein first finger part is disposed between the second extending portion and the at least one memory structure and extends into the first extending portion; and the second finger part connects with the first finger part and extends into the second extending portion.

8. The 3D memory device according to claim 1, wherein the etching stop structure has a profile on a cross-sectional plane parallel to the bottom surface selected from a group consisting of linear, corrugated, wavy, circular, polygonal, curved and any combination thereof.

9. The 3D memory device according to claim 1, further comprising a first filled slit and a second filled slit passing through the multi-layers stack to make the at least one memory structure and the etching stop structure disposed between the first filled slit and the second filled slit.

10. A method tor fabricating a 3D memory device comprising:
   providing a substrate having a trench;
   forming a multi-layers stack having a first extending portion and a second extending portion in the trench to make the second extending portion and a bottom surface of the trench forming a non-straight angle, wherein both of the first extending portion and the second extending portion include a plurality of conductive layers and a plurality of insulating layers alternatively stacked in the trench;
   forming at least one memory structure in the first extending portion; and
   forming an etching stop structure having a set of materials identical to another set of materials in the memory structure and at least partially extending into the second extending portion.

11. The method according to claim 10, wherein the at least one memory structure and the etching stop structure are formed by the same process.

12. The method according to claim 10, wherein the forming of the etching stop structure comprises:
   patterning the multi-layers stack to form at least one first opening at least partially passing through the stacking layers and the insulating layers involved in the first extending portion, and at least one second opening at least partially passing through the stacking layers and the insulating layers involved in the second extending portion;
   forming a memory layer and a channel layer in sequence on sidewalls of the first opening and the second opening; and
   filling the first opening and the second opening with a dielectric material.

13. The method according to claim 10, further comprising steps of forming an etching stop block in the trench and adjacent to a sidewall of the trench prior to the forming of the multi-layers stack.

14. The method according to claim 13, wherein the stacking layers are a plurality of conductive layers, each one of the conductive layers and the insulating layers extends along the bottom surface and the sidewall of the trench.

15. The method according to claim 10, wherein the stacking layers are a plurality of sacrificing layers, and after the forming of the multi-layers stack, further comprises:
   forming a first slit and a second slit passing through the multi-layers stack to make the memory structure and the etching stop structure disposed between the first slit and the second slit;
   removing the sacrificing layers;
   forming a plurality of conductive layers on positions where the sacrificing layers initially occupied; and
   filling the first slit and the second slit with a dielectric material.

* * * * *